United States Patent
Ishibashi et al.

(10) Patent No.: US 9,237,638 B2
(45) Date of Patent: Jan. 12, 2016

(54) PLASMA PROCESSING APPARATUS AND SUBSTRATE PROCESSING METHOD

(75) Inventors: Kiyotaka Ishibashi, Hyogo (JP); Osamu Morita, Hyogo (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 424 days.

(21) Appl. No.: 13/391,310

(22) PCT Filed: Aug. 16, 2010

(86) PCT No.: PCT/JP2010/063831
§ 371 (c)(1),
(2), (4) Date: Mar. 14, 2012

(87) PCT Pub. No.: WO2011/021607
PCT Pub. Date: Feb. 24, 2011

(65) Prior Publication Data
US 2012/0160809 A1    Jun. 28, 2012

(30) Foreign Application Priority Data

Aug. 21, 2009    (JP) .................................. 2009-191700

(51) Int. Cl.
| | |
|---|---|
| C23C 16/00 | (2006.01) |
| C23F 1/00 | (2006.01) |
| H01L 21/306 | (2006.01) |
| H05H 1/46 | (2006.01) |

(Continued)

(52) U.S. Cl.
CPC ................ *H05H 1/46* (2013.01); *C23C 16/511* (2013.01); *H01J 37/3222* (2013.01); *H01J 37/32192* (2013.01); *H01J 37/32229* (2013.01); *H05H 2001/463* (2013.01)

(58) Field of Classification Search
USPC ............................. 156/345.41; 118/723 MW
See application file for complete search history.

(56) References Cited

U.S. PATENT DOCUMENTS

| | | |
|---|---|---|
| 6,910,440 B2 | 6/2005 | Ishii et al. |
| 2001/0026575 A1 | 10/2001 | Sato et al. |
| 2002/0043937 A1 | 4/2002 | Ogura |

(Continued)

FOREIGN PATENT DOCUMENTS

| | | |
|---|---|---|
| JP | 2001-176857 A | 6/2001 |
| JP | 2002-124196 A | 4/2002 |

(Continued)

OTHER PUBLICATIONS

International Search Report for PCT/JP2010/063831 dated Sep. 21, 2010.

*Primary Examiner* — Rakesh Dhingra
(74) *Attorney, Agent, or Firm* — Pearne & Gordon LLP

(57) ABSTRACT

A microwave supply unit 20 of a plasma processing apparatus 11 includes a stub member 51 configured to be extensible from the outer conductor 33 toward the inner conductor 32. The stub member 51 serves as a distance varying device for varying a distance in the radial direction between a part of the outer surface 36 of the inner conductor 32 and a facing member facing the part of the outer surface of the inner conductor 32 in the radial direction, i.e., the cooling plate protrusion 47. The stub member 51 includes a rod-shaped member 52 supported at the outer conductor 33 and configured to be extended in the radial direction; and a screw 53 as a moving distance adjusting member for adjusting a moving distance of the rod-shaped member 52 in the radial direction.

8 Claims, 9 Drawing Sheets

(51) Int. Cl.
*C23C 16/511* (2006.01)
*H01J 37/32* (2006.01)

(56) References Cited

U.S. PATENT DOCUMENTS

| | | | |
|---|---|---|---|
| 2002/0112819 A1* | 8/2002 | Kamarehi et al. | 156/345.36 |
| 2002/0148564 A1 | 10/2002 | Ishii | |
| 2004/0261717 A1* | 12/2004 | Ishii et al. | 118/723.001 |
| 2005/0034815 A1* | 2/2005 | Kasai et al. | 156/345.41 |
| 2005/0082004 A1* | 4/2005 | Kasai | 156/345.41 |
| 2006/0124244 A1 | 6/2006 | Ishii et al. | |

FOREIGN PATENT DOCUMENTS

| | | |
|---|---|---|
| JP | 2003-234327 A | 8/2003 |
| JP | 2004-265611 A | 9/2004 |
| JP | 2006-179477 A | 7/2006 |
| JP | 2008-182713 A | 8/2008 |
| KR | 10-2002-0088413 A | 11/2002 |
| TW | 497367 | 8/2002 |
| TW | 200739714 | 10/2007 |

* cited by examiner

PLASMA PROCESSING APPARATUS AND SUBSTRATE PROCESSING METHOD

CROSS-REFERENCE TO RELATED APPLICATION

This Application is a U.S. national phase application under 35 U.S.C. §371 of PCT Application No. PCT/JP2010/063831 filed on Aug. 16, 2010, which claims the benefit of Japanese Patent Application No. 2009-191700 filed on Aug. 21, 2009, the entire disclosures of which are incorporated herein by reference.

TECHNICAL FIELD

The present disclosure relates to a plasma processing apparatus and a substrate processing method; and, more particularly, to a plasma processing apparatus using microwave as a plasma source and a substrate processing method that is performed by the plasma processing apparatus.

BACKGROUND ART

A semiconductor device such as a LSI (Large Scale Integrated circuit) is manufactured by performing various processes such as an etching process, a CVD (Chemical Vapor Deposition) process, a sputtering process on a semiconductor substrate. A processing method using plasma as an energy source, i.e., a plasma etching process, a plasma CVD process or a plasma sputtering process may be used to perform the etching process, the CVD process or the sputtering process.

Here, a microwave plasma processing apparatus using microwave for generating plasma is described in Japanese Patent Laid-open Publication No. 2006-179477 (Patent Document 1). In Patent Document 1, a dummy load is connected to a cylindrical waveguide positioned between a circular/rectangular waveguide and a circular polarized wave converter. An axis line of this dummy load is deviated from a microwave reflecting body toward the circular polarized wave converter by about ¼ wavelength (L) of a waveguide wavelength of a standing wave reflected from the microwave reflecting body. With this configuration, microwave reflected from a radial waveguide box is effectively absorbed by the dummy load.

Patent Document 1: Japanese Patent Laid-open Publication No. 2006-179477

A conventional plasma processing apparatus described in Patent Document 1 will be briefly explained. FIG. 15 is an enlarged cross sectional view schematically illustrating a part of a conventional plasma processing apparatus. A vertical direction of FIG. 15 corresponds to a vertical direction of the plasma processing apparatus. In FIG. 15, microwaves are also illustrated as images at certain locations.

Referring to FIG. 15, a plasma processing apparatus 101 includes a processing chamber for performing therein a plasma process on a processing target substrate; a circular plate-shaped dielectric plate 102; a thin circular plate-shaped slot antenna plate 103; a circular plate-shaped wavelength shortening plate 104; a microwave generator 105; and a microwave supply unit 106. The dielectric plate 102 transmits microwave into the processing chamber. The slot antenna plate 103 is provided with a multiple number of slot holes (not illustrated) formed through the slot antenna plate 103 in a thickness direction thereof. Further, the slot antenna plate 103 is provided on the dielectric plate 102 and radiates the microwave into the dielectric plate 102. The wavelength shortening plate 104 is provided on the slot antenna plate 103 and transmits the microwave in a radial direction thereof. The microwave generator 105 is disposed outside the processing chamber and generates the microwave. The microwave supply unit 106 is configured to supply the microwave generated by the microwave generator 105 into the processing chamber.

The microwave supply unit 106 includes a vertically elongated coaxial waveguide 107 connected to the slot antenna plate 103. The coaxial waveguide 107 includes a circular rod-shaped inner conductor 108 and an outer conductor 109 disposed outside the inner conductor 108 with a gap 110 therebetween in the radial direction thereof.

In order to generate uniformized plasma under the dielectric plate 102 in a circumferential direction of the dielectric plate 102, the inner conductor 108 of the coaxial waveguide 107 is connected to the slot antenna plate 103 such that a center of the inner conductor 108 in the radial direction aligns with a center of the slot antenna plate 103 in the radial direction. Further, the outer conductor 109 is disposed such that its center in the radial direction coincides with the center of the inner conductor 108 in the radial direction.

In general, in the plasma processing apparatus 101 having the aforementioned configuration, the inner conductor 108 and the outer conductor 109 of the coaxial waveguide 107 are manufactured as separate bodies. Then, the inner conductor 108 and the outer conductor 109 manufactured as separate bodies are combined such that a center of the inner conductor 108 in the radial direction is coincident with a center of the outer conductor 109 in the radial direction. Thereafter, the coaxial waveguide 107 is mounted in the plasma processing apparatus 101 such that the center of the inner conductor 108 in the radial direction aligns with the center of the slot antenna plate 103 in the radial direction. In FIG. 15, a center line indicating the center of the inner conductor 108 in the radial direction is marked by a dashed dotted line 111, and a center line indicating the center of the outer conductor 109 in the radial direction is marked by a dashed double-dotted line 112.

Here, when manufacturing the coaxial waveguide 107, specifically, when combining the inner conductor 108 and the outer conductor 109, the center of the inner conductor 108 in the radial direction and the center of the outer conductor 109 in the radial direction may be deviated from each other. Such a deviation amount is denoted by a length dimension X in FIG. 15. Actually, the deviation amount is about 0.05 mm. For the convenience of understanding, the length dimension X in FIG. 15 is shown as being larger in an exaggerated form than an actual deviation dimension.

If such a deviation is generated, a length of the gap 110 between the inner conductor 108 and the outer conductor 109 in the radial direction becomes non-uniform in a circumferential direction of the coaxial waveguide 107. As a result, intensity of the microwave propagating within the coaxial waveguide 107 also becomes non-uniform in the circumferential direction of the coaxial waveguide 107. Consequently, the intensity of the microwave propagated to the dielectric plate 102 also becomes non-uniform in the circumferential direction thereof, resulting in a non-uniform distribution of an electromagnetic field formed under the dielectric plate 102 in a circumferential direction. Such a non-uniform distribution of the electromagnetic field may cause a non-uniform distribution of plasma generated within the processing chamber in a circumferential direction, resulting in non-uniformity of the plasma process within the surface of the processing target substrate.

Here, when assembling the coaxial waveguide 107, it is very difficult to reduce the deviation between the centers of the inner conductor 108 and the outer conductor 109 so as not to cause the non-uniformity of plasma distribution, and thus, a high equipment cost may be required. Furthermore, the same problems may also be caused when positioning the wavelength shortening plate and the dielectric plate.

DISCLOSURE OF THE INVENTION

Problems to Be Solved by the Invention

In view of the foregoing, illustrative embodiments provide a plasma processing apparatus capable of generating uniformized plasma under a dielectric plate.

Further, illustrative embodiments also provide a substrate processing method capable of performing a process uniformly within a surface of a processing target substrate.

Means for Solving the Problems

In accordance with one aspect of an illustrative embodiment, there is provided a plasma processing apparatus. The apparatus includes a processing chamber, having a top opening, configured to perform therein a plasma process on a processing target substrate; a gas supply unit configured to supply a plasma processing gas into the processing chamber; a mounting table that is provided within the processing chamber and is configured to mount the processing target substrate thereon; a microwave generator configured to generate a microwave for plasma excitation; a dielectric plate placed for sealing the processing chamber hermetically by covering the top opening of the processing chamber and configured to transmit the microwave into the processing chamber; a slot antenna plate, having a plurality of slot holes, provided on the dielectric plate and configured to radiate the microwave into the dielectric plate; a wavelength shortening plate provided on the slot antenna plate and configured to propagate the microwave in a radial direction; and a microwave supply unit configured to supply the microwave generated by the microwave generator to the slot antenna plate. The microwave supply unit may include a coaxial waveguide and a distance varying device. The coaxial waveguide may include a substantially circular rod-shaped inner conductor whose one end is connected to a center of the slot antenna plate and a substantially cylindrical outer conductor provided outside the inner conductor with a gap therebetween in a radial direction. The distance varying device may be configured to vary a distance between a part of an outer surface of the inner conductor and a facing member facing the part of the outer surface of the inner conductor in a radial direction.

In accordance with the plasma processing apparatus, even if the centers of the inner conductor and the outer conductor of the coaxial waveguide are deviated when the coaxial waveguide is manufactured, the distance between the part of the outer surface of the inner conductor and the facing member facing the part of the outer surface of the inner conductor in the radial direction can be adjusted by the distance varying device for varying the distance between the part of the outer surface of the inner conductor and the facing member facing the part of the outer surface of the inner conductor. Accordingly, the microwave can be non-uniformly (asymmetrically) propagated within the coaxial waveguide in the circumferential direction. In this way, it may be possible to prevent non-uniform distribution of the electromagnetic field formed at the dielectric plate in the circumferential direction, which is caused by the deviation between the centers of the inner conductor and the outer conductor. As a result, the plasma can be uniformly generated on the lower surface of the dielectric plate within the processing chamber. In such a case, it may be also possible to prevent non-uniform distribution of the electromagnetic field in the circumferential direction, which is caused by the error in mounting the wavelength shortening plate. Consequently, a process can be performed uniformly within the surface of the processing target substrate.

The distance varying device may include at least one stub member extensible from the outer conductor toward the inner conductor.

The stub member may include a rod-shaped member supported at the outer conductor and extensible in the radial direction; and a moving distance adjusting member for adjusting a moving distance of the rod-shaped member in the radial direction.

The at least one stub member may be plural in number, and the stub members may be arranged with a gap therebetween along an elongated direction of the coaxial waveguide.

Alternatively, the at least one stub member may be plural in number, and the stub members may be arranged at an interval in a circumferential direction.

Desirably, the stub members may be arranged at a regular interval in the circumferential direction.

At least a part of the stub member to be located in the gap may be made of a dielectric material.

A distance between an upper end of the wavelength shortening plate and the stub member in an axial direction of the coaxial waveguide may be equal to or smaller than about 10 mm.

The distance varying device may be configured to control a distance between the part of the outer surface of the inner conductor and the facing member thereto in the radial direction to be equal to or smaller than about 4 mm.

The microwave generator may include a magnetron, an isolator and a tuner.

In accordance with another aspect of an illustrative embodiment, there is provided a substrate processing method for performing a plasma process on a processing target substrate by a plasma processing apparatus. The plasma processing apparatus includes a processing chamber, having a top opening, configured to perform therein a plasma process on a processing target substrate; a gas supply unit configured to supply a plasma processing gas into the processing chamber; a mounting table that is provided within the processing chamber and is configured to mount the processing target substrate thereon; a microwave generator configured to generate a microwave for plasma excitation; a dielectric plate placed for sealing the processing chamber hermetically by covering the top opening of the processing chamber and configured to transmit the microwave into the processing chamber; a slot antenna plate, having a plurality of slot holes, provided on the dielectric plate and configured to radiate the microwave into the dielectric plate; a wavelength shortening plate provided on the slot antenna plate and configured to propagate the microwave in a radial direction; and a microwave supply unit configured to supply the microwave generated by the microwave generator to the slot antenna plate. The microwave supply unit may include a coaxial waveguide and a distance varying device. The coaxial waveguide may include a substantially circular rod-shaped inner conductor whose one end is connected to a center of the slot antenna plate and a substantially cylindrical outer conductor provided outside the inner conductor with a gap therebetween in a radial direction. The distance varying device may be configured to vary a distance between a part of an outer surface of the inner conductor and a facing member facing the part of the outer surface of the inner conductor in a radial direction. The plasma processing method includes mounting the processing target substrate on the mounting table; generating microwave by the microwave generator; and varying, by the distance varying device, the distance in the radial direction between the part of the outer surface of the inner conductor and the facing member facing the part of the outer surface of the inner conductor in order to uniformly generate plasma under a lower surface of the dielectric plate in the processing chamber.

In accordance with the substrate processing method, it is possible to perform the process uniformly within the surface of the processing target substrate.

Effect of the Invention

In accordance with a plasma processing apparatus of an illustrative embodiment, even if centers of an inner conductor and an outer conductor of a coaxial waveguide are deviated when the coaxial waveguide is manufactured, a distance between a part of an outer surface of the inner conductor and a facing member facing the part of the outer surface of the inner conductor in a radial direction can be adjusted by a distance varying device for varying the distance between the part of the outer surface of the inner conductor and the facing member facing the part of the outer surface of the inner conductor. Accordingly, microwave can be non-uniformly (asymmetrically) propagated within the coaxial waveguide in a circumferential direction. In this way, it may be possible to prevent non-uniform distribution of an electromagnetic field formed at a dielectric plate in the circumferential direction, which is caused by a deviation between the centers of the inner conductor and the outer conductor. As a result, plasma can be uniformly generated on a lower surface of the dielectric plate within a processing chamber. In such a case, it may be also possible to prevent non-uniform distribution of the electromagnetic field in the circumferential direction, which is caused by the error in mounting a wavelength shortening plate. Consequently, a process can be performed uniformly within a surface of a processing target substrate.

Further, in accordance with the substrate processing method as stated above, it is possible to perform the process uniformly within the surface of the processing target substrate.

BEST MODE FOR CARRYING OUT THE INVENTION

Figure 1:
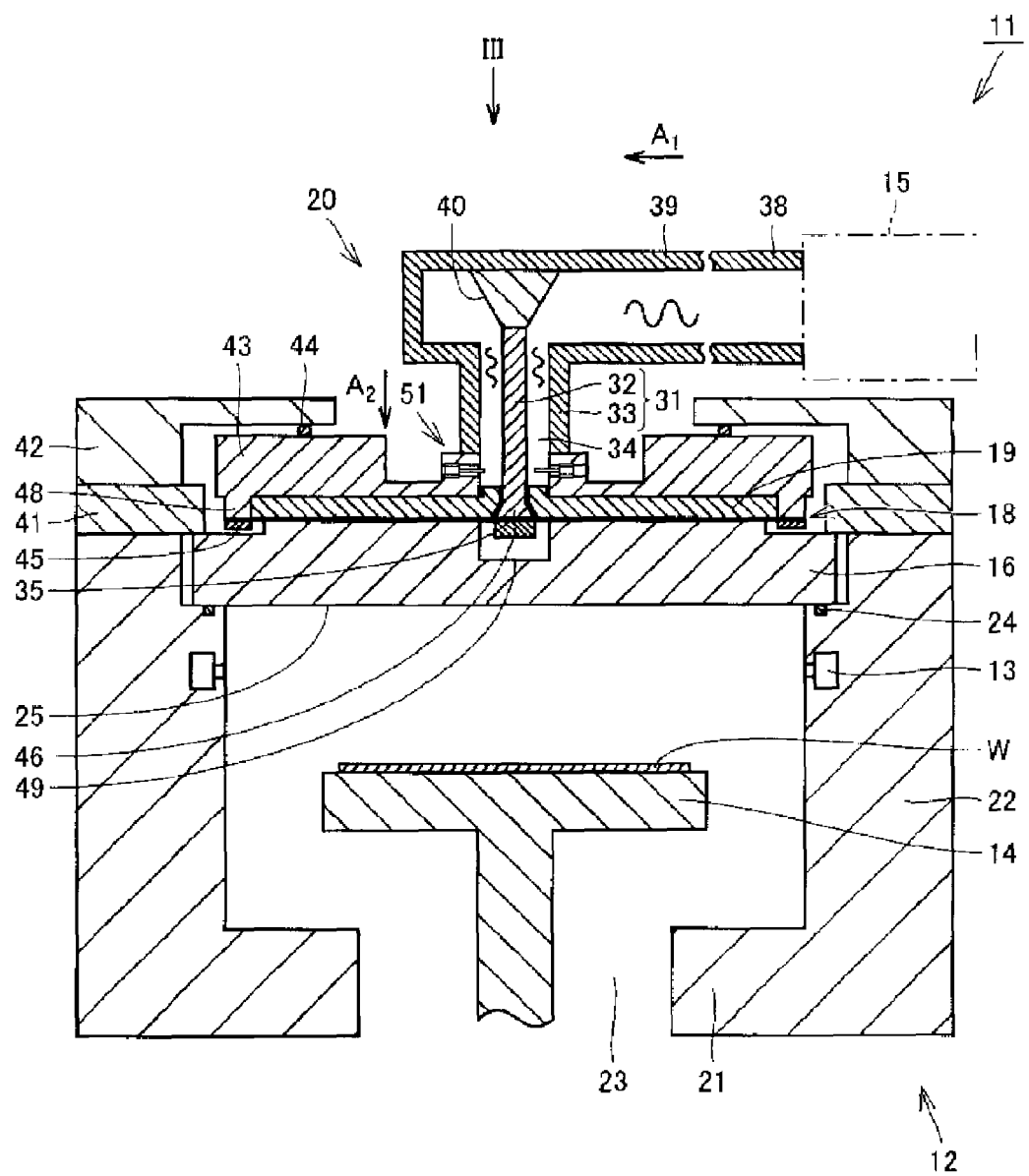
FIG. 1 is a schematic cross sectional view illustrating major components of a plasma processing apparatus in accordance with an illustrative embodiment.
Figure 2:
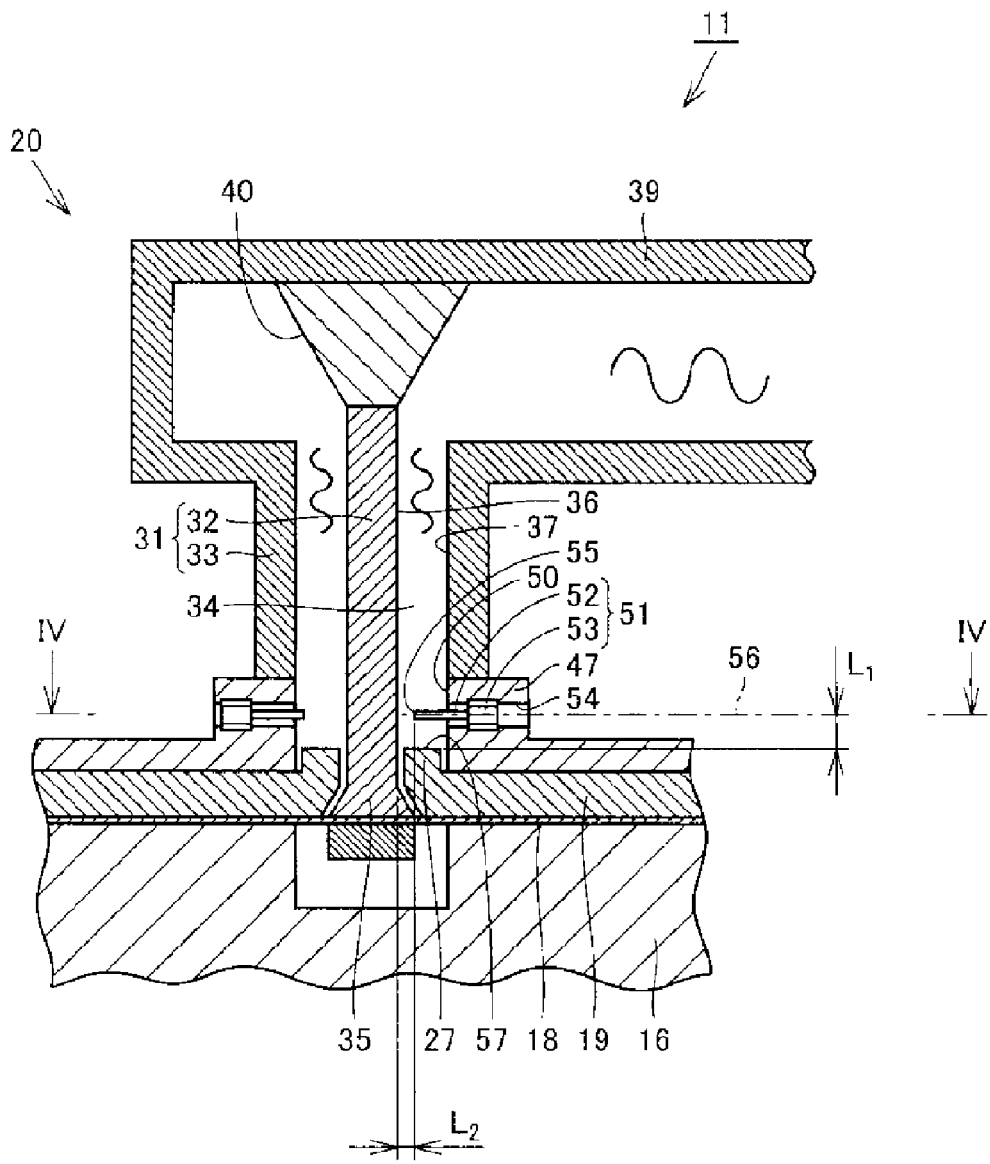
FIG. 2 is an enlarged schematic cross sectional view illustrating a coaxial waveguide and the vicinity thereof included in the plasma processing apparatus of FIG. 1.
Figure 3:
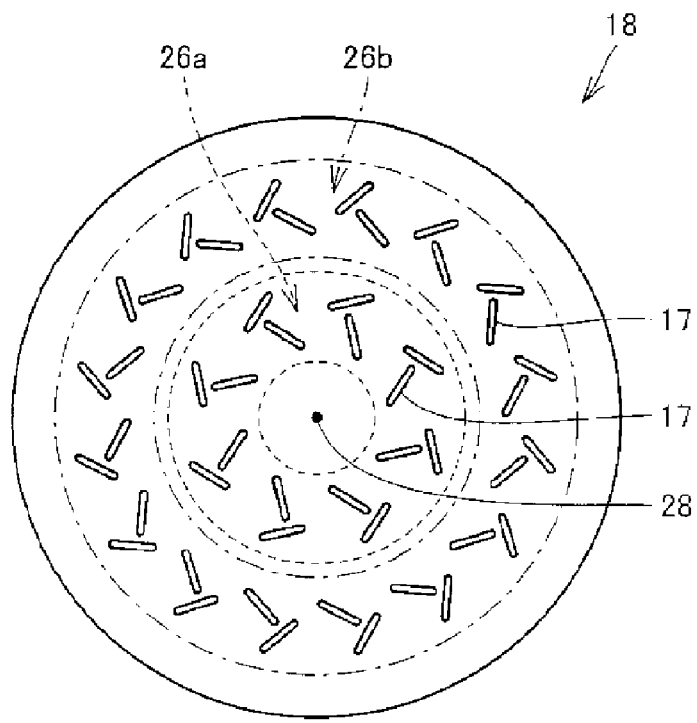
FIG. 3 is a diagram showing a slot antenna plate included in the plasma processing apparatus shown in FIG. 1, when viewed from a direction of an arrow III of FIG. 1.
Figure 4:
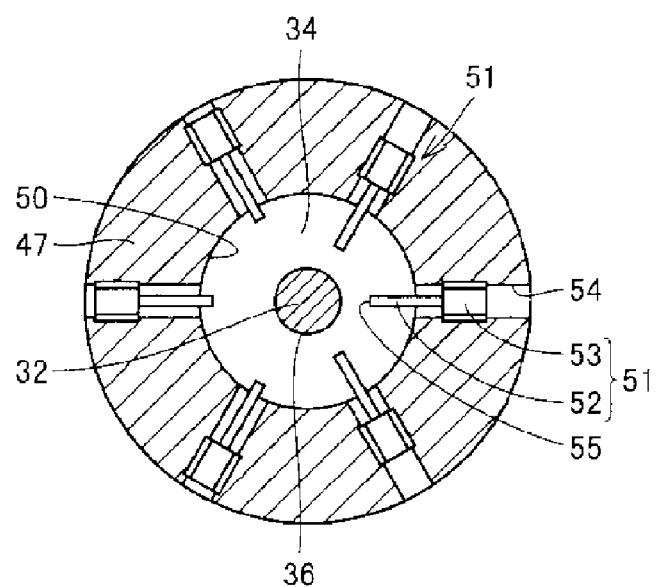
FIG. 4 is a cross sectional view of the coaxial waveguide of the plasma processing apparatus of FIG. 1, taken along a line IV-IV of FIG. 2.

Hereinafter, illustrative embodiments will be described with reference to the accompanying drawings. FIG. 1 is a schematic cross sectional view illustrating major components of a plasma processing apparatus in accordance with an illustrative embodiment. FIG. 2 provides an enlarged schematic cross sectional view illustrating a coaxial waveguide and the vicinity thereof included in the plasma processing apparatus of FIG. 1. FIG. 3 is a diagram illustrating a slot antenna plate included in the plasma processing apparatus of FIG. 1, when viewed from a direction of an arrow III of FIG. 1. FIG. 4 is a cross sectional view of the coaxial waveguide included in the plasma processing apparatus of FIG. 1, taken along a line IV-IV of FIG. 2. In FIGS. 1 and 2, a vertical direction of the drawings corresponds to a vertical direction of the plasma processing apparatus. Further, the term 'radial direction' used in the entire specification refers to a direction from an inner conductor toward an outer conductor within the coaxial waveguide of FIG. 4.

Referring to FIGS. 1 to 4, a plasma processing apparatus 11 includes a processing chamber 12, a gas supply unit 13, a holding table 14, a microwave generator 15, a dielectric plate 16, a thin-plate shaped slot antenna plate 18, a wavelength shortening plate 19, a microwave supply unit 20, and a controller (not shown). The processing chamber 12 has a top opening and is configured to perform therein a plasma process on a processing target substrate W. The gas supply unit 13 is configured to supply a gas for plasma excitation and a gas for the plasma process into the processing chamber 12.

The holding table 14 is provided within the processing chamber 12 and holds thereon the processing target substrate W. The microwave generator 15 is provided outside the processing chamber 12 and generates microwave for plasma excitation. The dielectric plate 16 is placed so as to cover the top opening of the processing chamber 12 and airtightly seals the processing chamber 12. The dielectric plate 16 transmits the microwave into the processing chamber 12. The slot antenna plate 18 is provided with a multiple number of slot holes 17 and is placed on the dielectric plate 16. The slot antenna plate 18 radiates the microwave into the dielectric plate 16. The wavelength shortening plate 19 is provided on the slot antenna plate 18 and transmits the microwave in a radial direction thereof. The microwave supply unit 20 supplies the microwave generated by the microwave generator 15 into the processing chamber 12. The controller controls an overall operation of the plasma processing apparatus 11. The controller controls processing conditions for performing the plasma process on the processing target substrate W, such as a gas flow rate in the gas supply unit 13 and an internal pressure of the processing chamber 12. The microwave generator 15 is indicated by a dashed dotted line of FIG. 1.

The processing chamber 12 includes a bottom 21 positioned under the holding table 14; and a sidewall 22 upwardly extending from the periphery of the bottom 21. The sidewall 22 has a cylindrical shape. A gas exhaust hole 23 for gas exhaust is formed in a central portion of the bottom of the processing chamber 12 in the radial direction. The top of the processing chamber 12 is open, and the processing chamber 12 can be hermetically sealed by the dielectric plate 16 placed at the top of the processing chamber 12 with an O-ring 24 as a sealing member provided between the dielectric plate 16 and the processing chamber 12. Further, a part of the gas supply unit 13 is embedded in the sidewall 22. The gas supply unit 13 supplies a gas into the processing chamber 12 from an outside thereof.

A lower surface 25 of the dielectric plate 16 is flat. The dielectric plate 16 is made of a dielectric material. By way of non-limiting example, the dielectric plate 16 may be made of quartz or alumina.

Both opposite surfaces of the slot antenna plate 18 in a thickness direction thereof are also flat. The slot antenna plate 18 is provided with the multiple number of slot holes 17 formed through the slot antenna plate 18 in the thickness direction thereof. Each slot hole 17 has two rectangular-shaped openings, and the two rectangular-shaped openings are arranged in a substantially T shape. The multiple number of slot holes 17 are divided into two group: an inner slot hole group 26a positioned at an inner periphery of the slot antenna plate 18; and an outer slot hole group 26b positioned at an outer periphery thereof. The inner slot hole group 26a includes eight slot holes 17 formed in a region surrounded by a dashed line of FIG. 3. The outer slot hole group 26b includes sixteen slot holes 17 formed in a region surrounded by a dashed dotted line of FIG. 3. The eight slot holes 17 of the inner slot hole group 26a are annularly arranged at a regular interval, and the sixteen slot holes 17 of the outer slot hole group 26b are also annularly arranged at a regular interval. The slot antenna plate 18 has rotational symmetry with respect to its center 28 in the radial direction. By way of example, even if the slot antenna plate 18 is rotated by about 45° with respect to the center 28, it still has the same shape.

Formed in a center of the wavelength shortening plate is an opening for accommodating therein an inner conductor 32 of a coaxial waveguide 31 to be described later. An inner end portion of the wavelength shortening plate 19 surrounding the opening is protruded in a thickness direction of the wavelength shortening plate 19. That is, the wavelength shortening plate 19 has a ring-shaped wavelength shortening plate protrusion 27 protruded from the inner end portion of the wavelength shortening plate 19 in the thickness direction thereof. The wavelength shortening plate 19 is mounted such that the wavelength shortening plate protrusion 27 faces upward. The wavelength shortening plate 19 is made of a dielectric material such as, but not limited to, quartz or alumina. A wavelength of the microwave propagating in the wavelength shortening plate 19 becomes shorter than a wavelength of microwave propagating in the air.

Each of the dielectric plate 16, the slot antenna plate 18 and the wavelength shortening plate 19 has a circular plate shape. When manufacturing the plasma processing apparatus 11, the centers of the dielectric plate 16, the slot antenna plate 18 and the wavelength shortening plate 19 in the radial direction thereof are aligned to each other. By aligning their centers, the microwave can be uniformly propagated from a central side toward a peripheral side in a circumferential direction of the dielectric plate 16, so that plasma can also be uniformly generated under the dielectric plate 16 along the circumferential direction thereof. Here, the center 28 of the slot antenna plate 18 serves as a reference for the alignment.

The microwave supply unit 20 includes the coaxial waveguide 31 having the inner conductor 32 and the outer conductor 33. The inner conductor 32 has a substantially circular rod shape, and one end 35 of the inner conductor 32 is connected to the center 28 of the slot antenna plate 18. The outer conductor 33 has a substantially cylindrical shape and is provided at an outside of the inner conductor 32 with a gap therebetween in the radial direction. That is, in the coaxial waveguide 31, the inner conductor 32 is combined with the outer conductor 33 such that an outer surface 36 of the inner conductor 32 faces an inner surface 37 of the outer conductor 33. The coaxial waveguide 31 is elongated in a vertical direction of FIG. 1. The inner conductor 32 and the outer conductor 33 are manufactured as separate bodies. Then, the inner conductor 32 is combined with the outer conductor 33 such that a center of the inner conductor in the radial direction is coincident with a center of the outer conductor 33 in the radial direction.

Moreover, the microwave supply unit 20 further includes a waveguide 39 whose one end 38 is connected to the microwave generator 15; and a mode converter 40 configured to convert a mode of the microwave. The waveguide 39 is elongated in a horizontal direction, specifically, in a left-right direction of FIG. 1. The waveguide 39 may have a circular cross section or a rectangular cross section.

Figure 16:
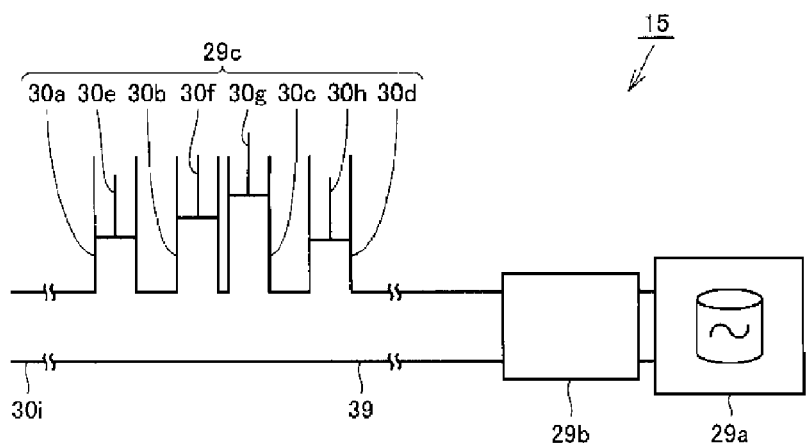
FIG. 16 is a schematic configuration view of a microwave generator.

Here, a configuration of the microwave generator 15 will be briefly explained as follows. FIG. 16 is a schematic configuration view illustrating the microwave generator 15. As depicted in FIG. 16, the microwave generator 15 includes a magnetron 29a positioned at an upstream side; an isolator 29b positioned at a downstream side of the magnetron 29a; and a 4E tuner 29c positioned at a downstream side from the isolator 29b. The magnetron 29a generates microwave. When the microwave generated by the magnetron 29a is supplied toward the downstream side, the isolator 29b removes reflection wave reflected from the downstream side. The 4E tuner 29c serves as a matching unit for adjusting phase of the microwave when the microwave generated by the magnetron 29a is transmitted toward the downstream side. Here, it is assumed that the microwave is propagated from the upstream side toward the downstream side. That is, the magnetron 29a, the isolator 29b and the 4E tuner 29c are located from the most upstream side in a sequence. The 4E tuner 29c includes four recesses 30a, 30b, 30c and 30d; and four movable short-circuit plates 30e, 30f, 30g and 30h. The four recesses 30a to 30d are provided in a propagation direction of the microwave and formed toward the outside of the waveguide. The four movable short-circuit plates 30e to 30h are accommodated within the four recesses 30a to 30d, respectively, and are movable in the radial direction. The movable short-circuit plates 30e to 30h have shapes capable of covering the recesses 30a to 30d, respectively. Here, the radial direction refers to a vertical direction in FIG. 16. By moving the respective movable short-circuit plates 30e to 30h in the radial direction, the phase of the microwave propagated within the waveguide 39 is adjusted. In FIG. 16, a left end 30i is connected to the end 38 of the waveguide 39 in FIG. 1.

The microwave generated by the microwave generator 15 is propagated into the processing chamber 12 through the waveguide 39 and the coaxial waveguide 31. A frequency of the microwave generated by the microwave generator 15 may be, e.g., about 2.45 GHz.

By way of example, the microwave of a TE mode generated by the microwave generator 15 is propagated within the waveguide 39 in a leftward direction as indicated by an arrow $A_1$ of FIG. 1 and is converted to a TEM mode by the mode converter 40. Then, the microwave of the TEM mode is propagated within the coaxial waveguide 31 in a downward direction as indicated by an arrow $A_2$ of FIG. 1. To elaborate, the microwave is propagated between the inner conductor 32 and the outer conductor 33 spaced apart from each other by the gap 34 and between the inner conductor 32 and a cooling plate protrusion 47. The microwave that has been propagated through the coaxial waveguide 31 is propagated within the wavelength shortening plate 19 in the radial direction and radiated into the dielectric plate 16 through the multiple number of slot holes 17 of the slot antenna plate 18. An electric field is generated directly under the dielectric plate 16 by the microwave that has been propagated through the dielectric plate 16, and, thus, plasma is generated by the electric field within the processing chamber 12.

The plasma processing apparatus 11 further includes a dielectric plate pressing ring 41, an antenna pressing member 42, a cooling plate 43, an electromagnetic field shielding elastic body 44, a periphery fixing ring 45 and a center fixing plate 46. The dielectric plate pressing ring 41 is provided on a top end of the sidewall 22 and serves to press the dielectric plate 16 from above. The antenna pressing member 42 is provided on the dielectric pressing ring 41 and serves to press the slot antenna plate 18 from above. The cooling plate 43 is provided on the wavelength shortening plate 19 and serves to cool the wavelength shortening plate 19 and so forth. The electromagnetic field shielding elastic body 44 is positioned between the antenna pressing member 42 and the cooling plate 43, and serves to shield the electromagnetic field within the processing chamber 12 from the outside thereof. The periphery fixing ring 45 fixes the periphery of the slot antenna plate 18, and the center fixing plate 46 fixes the center of the slot antenna plate 18.

Formed in a center of the cooling plate 43 is an opening for accommodating therein the coaxial waveguide 31. An inner end portion of the cooling plate 43 surrounding the opening is protruded in a thickness direction of the cooling plate 43. That is, the cooling plate 43 has a ring-shaped cooling plate protrusion 47 protruding from the inner end portion of the cooling plate 43 in the thickness direction thereof. The cooling plate 43 is mounted such that the cooling plate protrusion 47 faces upward.

The cylindrical outer conductor 33 is positioned on the cooling plate protrusion 47. An upper end of the cooling plate protrusion 47 is in contact with a lower end of the outer conductor 33. In this configuration, the inner surface 37 of the outer conductor 33 is arranged on the same plane of an inner surface 50 of the cooling plate protrusion 47. Accordingly, a distance between the outer surface 36 of the inner conductor 32 and the inner surface 37 of the outer conductor 33 in the radial direction is the same as a distance between the outer surface 36 of the inner conductor 32 and the inner surface 50 of the cooling plate protrusion in the radial direction. Further, above the wavelength shortening plate protrusion 27, there is provided the gap 34 between the inner conductor 32 and the outer conductor 33.

A wavelength shortening plate positioning member 48 that protrudes toward the dielectric plate 16 and has a ring shape is provided at an outer periphery of the cooling plate 43. A position of the wavelength shortening plate 19 is aligned in the radial direction by the wavelength shortening plate positioning member 48. The periphery fixing ring 45 fixes the slot antenna plate 18 at a position in the radial direction where the wavelength shortening plate positioning member 48 is provided.

Further, a receiving recess 49 for accommodating therein the center fixing plate 46 is formed from the upper surface thereof in a center of an upper surface of the dielectric plate 16 so as to reduce a thickness of the dielectric plate 16.

Here, the microwave supply unit 20 includes a stub member 51 configured to be extensible from the outer conductor 33 toward the inner conductor 32. The stub member serves as a distance varying device for varying a distance in the radial direction between a part of the outer surface 36 of the inner conductor 32 and a facing member facing the part of the outer surface of the inner conductor in the radial direction, i.e., the cooling plate protrusion 47.

The stub member 51 includes a rod-shaped member 52 supported at the outer conductor 33 and configured to be extended in the radial direction; and a screw 53 as a moving distance adjusting member for adjusting a moving distance of the rod-shaped member 52 in the radial direction. The screw is provided at an outer end portion of the rod-shaped member 52.

The stub member 51 is provided in the cooling plate protrusion 47. To elaborate, formed in the cooling plate protrusion 47 is a screw hole 54 straightly elongated through the cooling plate protrusion 47 in the radial direction. By screwing the screw 53 into the screw hole 54, the stub member 51 is fastened to the cooling plate protrusion 47. That is, the stub member 51 is supported by the screw 53 screwed into the screw hole 54 formed in the cooling plate protrusion 47 on the side of the outer conductor 33.

By rotating the screw 53, the entire stub member 51 including the rod-shaped member 52 can be moved in the radial direction. In FIG. 2, the stub member 51 is illustrated to be movable in a left-right direction of the drawing. Further, the moving distance of the stub member 51 is adjusted by a rotation amount of the screw 53.

A total number of six stub members 51 are arranged at a substantially regular interval in a circumferential direction (see FIG. 4). That is, the six stub members are arranged at an angular interval of about 60° in the circumferential direction.

The six stub members 51 can be independently moved in the radial direction. That is, positions of leading ends 55 of rod-shaped members 52 of the stub members 51 in the radial direction can be individually controlled.

In accordance with the plasma processing apparatus having the above-described configuration, even if the centers of the inner conductor and the outer conductor of the coaxial waveguide are deviated when the coaxial waveguide is manufactured, the distance between the part of the outer surface of the inner conductor and the facing member facing the part of the outer surface of the inner conductor in the radial direction can be adjusted by the distance varying device for varying the distance between the part of the outer surface of the inner conductor and the facing member facing the part of the outer surface of the inner conductor. Accordingly, the microwave can be non-uniformly (asymmetrically) propagated within the coaxial waveguide in the circumferential direction. In this way, it may be possible to prevent non-uniform distribution of the electromagnetic field formed at the dielectric plate in the circumferential direction, which is caused by the deviation between the centers of the inner conductor and the outer conductor. As a result, the plasma can be uniformly generated on the lower surface of the dielectric plate within the processing chamber. In such a case, it may be also possible to prevent non-uniform distribution of the electromagnetic field in the circumferential direction due to, e.g., an error caused when mounting the wavelength shortening plate. Consequently, a process can be performed uniformly within the surface of the processing target substrate.

That is, in the substrate processing method in accordance with the illustrative embodiment, a plasma process on a processing target substrate is performed by a plasma processing apparatus. The plasma processing apparatus includes a processing chamber, having a top opening, configured to perform therein a plasma process on a processing target substrate; a gas supply unit configured to supply a plasma processing gas into the processing chamber; a mounting table that is provided within the processing chamber and is configured to mount the processing target substrate thereon; a microwave generator configured to generate a microwave for plasma excitation; a dielectric plate placed for sealing the processing chamber hermetically by covering the top opening of the processing chamber and configured to transmit the microwave into the processing chamber; a slot antenna plate, having a plurality of slot holes, provided on the dielectric plate and configured to radiate the microwave into the dielectric plate; a wavelength shortening plate provided on the slot antenna plate and configured to propagate the microwave in a radial direction; and a microwave supply unit configured to supply the microwave generated by the microwave generator to the slot antenna plate. The microwave supply unit includes a coaxial waveguide. The coaxial waveguide includes a substantially circular rod-shaped inner conductor whose one end is connected to a center of the slot antenna plate and a substantially cylindrical outer conductor provided outside the inner conductor with a gap therebetween in a radial direction; and a distance varying device configured to vary a distance between a part of an outer surface of the inner conductor and a facing member facing the part of the outer surface of the inner conductor in a radial direction. The plasma processing method includes mounting the processing target substrate on the mounting table; generating microwave by the microwave generator; and varying, by the distance varying device, the distance in the radial direction between the part of the outer surface of the inner conductor and the facing member facing the part of the outer surface of the inner conductor in order to uniformly generate plasma under a lower surface of the dielectric plate in the processing chamber. The plasma processing method includes mounting the processing target substrate on the mounting table; generating microwave by the microwave generator; and varying, by the distance varying device, the distance in the radial direction between the part of the outer surface of the inner conductor and the facing member facing the part of the outer surface of the inner conductor in order to uniformly generate plasma under a lower surface of the dielectric plate in the processing chamber.

Figure 5:
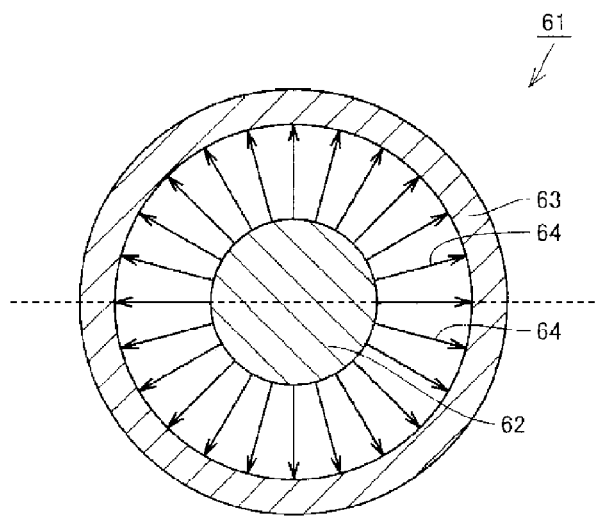
FIG. 5 is a schematic cross sectional view illustrating a coaxial waveguide not having a stub member, taken along a plane perpendicular to an axis of the coaxial waveguide.
Figure 6:
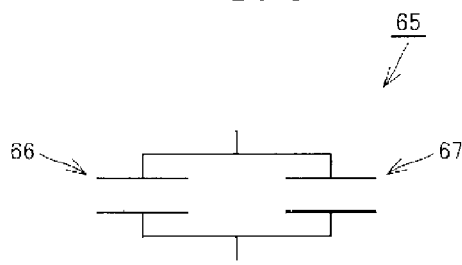
FIG. 6 is a schematic diagram illustrating a one-dimensional equivalent circuit of electric force lines shown in FIG. 5.
Figure 7:
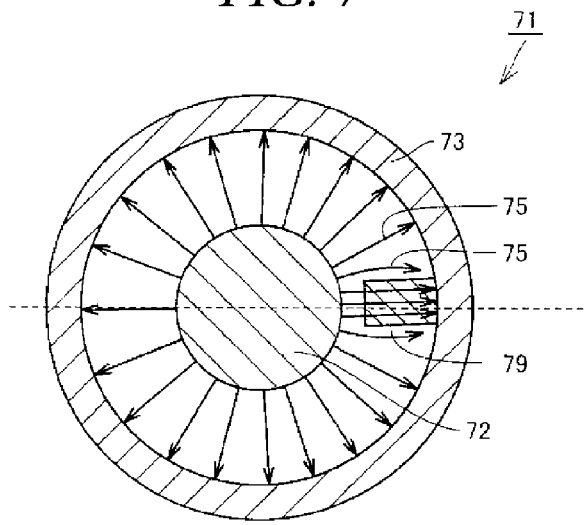
FIG. 7 is a schematic cross sectional view illustrating a coaxial waveguide having a stub member, taken along a plane perpendicular to an axis of the coaxial waveguide.
Figure 8:
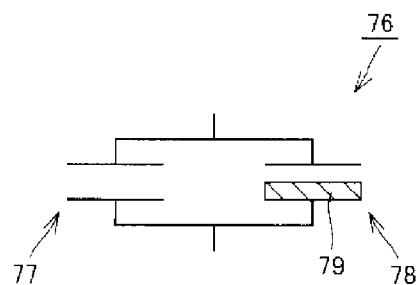
FIG. 8 is a schematic diagram illustrating a one-dimensional equivalent circuit of electric force lines shown in FIG. 7.

Here, the background that the present inventors have come to reach the illustrative embodiment will be discussed. FIG. 5 is a schematic diagram illustrating electric force lines within a conventional coaxial waveguide not having a stub member. FIG. 6 is a schematic diagram illustrating a one-dimensional equivalent circuit of the electric force lines shown in FIG. 5 on a dotted line shown in FIG. 5. FIG. 7 is a schematic diagram illustrating electric force lines in a coaxial waveguide having a stub member in accordance with an illustrative embodiment. FIG. 8 is a schematic diagram illustrating a one-dimensional equivalent circuit of the electric forces line shown in FIG. 7 on a dotted line shown in FIG. 7. Here, the total number of the electric forces lines depends on a power of microwave. For the convenience of understanding, only an inner conductor and an outer conductor included in the coaxial waveguide is depicted.

Referring to FIGS. 5 and 6, when no stub member is provided, electric force lines 64 extended from an inner conductor 62 toward an outer conductor 63 within a coaxial waveguide 61 are uniformized in a circumferential direction. In a one-dimensional equivalent circuit 65, capacitances of left and right capacitors 66 and 67 become equivalent. Such uniform electric force lines 64 are generated when a center of the inner conductor 62 and a center of the outer conductor 63 in a radial direction are almost completely coincident.

Figure 15:
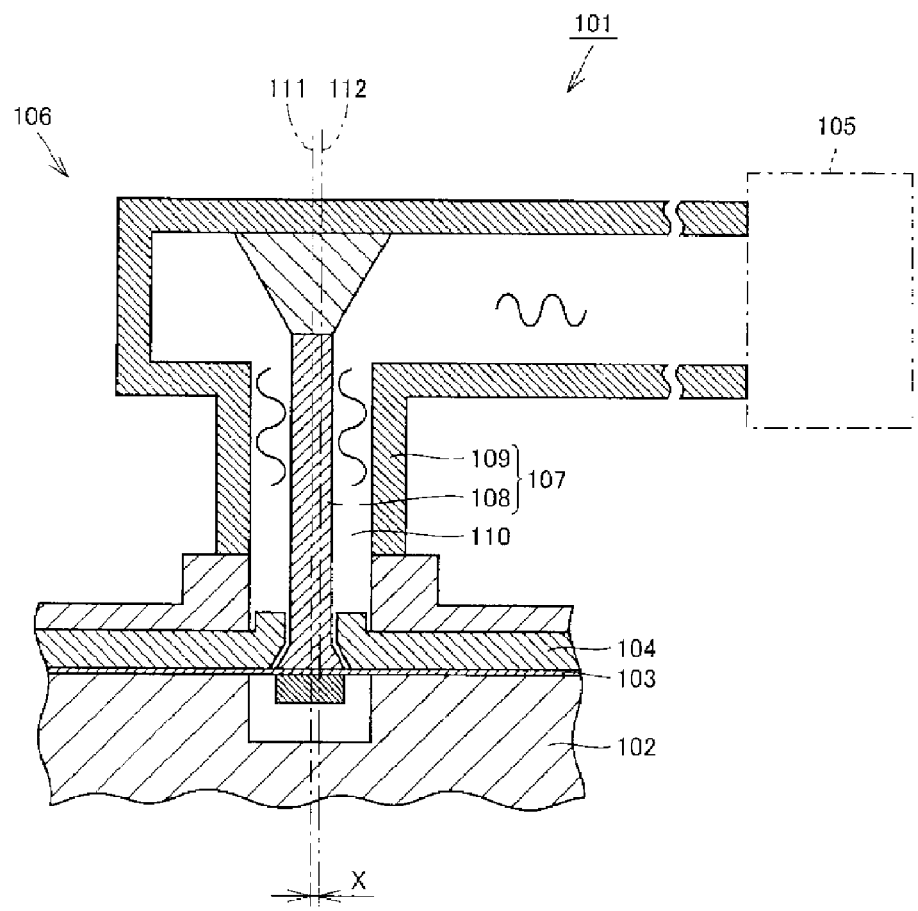
FIG. 15 is an enlarged schematic cross sectional view illustrating a coaxial waveguide and the vicinity thereof included in a conventional plasma processing apparatus.

Here, if the centers of the inner conductor 62 and the outer conductor 63 in the radial direction are deviated, the electric force lines 64 become non-uniform. As a consequence, the plasma becomes non-uniform in the circumferential direction. In such a case, in order to achieve uniformity of the plasma in the circumferential direction, the inner conductor 62 and the outer conductor 63 need to be reassembled such that their centers in the radial direction are almost completely coincident, as illustrated in FIG. 5. To be specific, as shown in FIG. 15, a length dimension X indicating a deviation amount between the center of the inner conductor and the center of the outer conductor in the radial direction needs to be as small as about 0.01 mm.

Meanwhile, referring to FIGS. 7 and 8, in a coaxial waveguide 71 having a stub member in accordance with an illustrative embodiment, when centers of an inner conductor 72 and an outer conductor 73 of the coaxial waveguide 71 in a radial direction are deviated from each other, a stub member 74 can be moved in the radial direction. If there is provided a portion where a distance in the radial direction between an outer surface of the inner conductor 72 and other member, e.g., the stub member 74 is shorter, the electric force lines 75 would be concentrated to that portion. As a result, in a one-dimensional equivalent circuit 76, a capacitance of a right capacitor 78 becomes larger than a capacitance of a left capacitor 77, resulting from being affected by the stub member 74 marked by hatches 79 in FIG. 8. Accordingly, by varying a moving distance of the stub member 74 in the radial direction, specifically, by varying the distance in the radial direction between the outer surface of the inner conductor 72 and the stub member 74, a balance of the electric force lines 75 in the circumferential direction is adjusted, so that the plasma can be uniformly generated in the circumferential direction.

Figure 9:
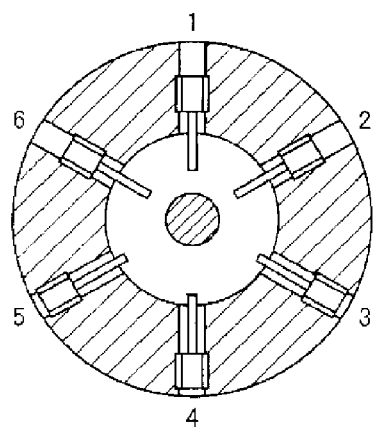
FIG. 9 is a cross sectional view of a coaxial waveguide, having six stub members, included in a plasma processing apparatus in accordance with the illustrative embodiment, and illustrates positions of the stub members.

Now, an effect of varying the distance between the stub member and the inner conductor will be discussed. FIG. 9 is a cross sectional view of a coaxial waveguide. FIG. 9 shows positions of respective stub members. Further, the cross sectional view shown in FIG. 9 corresponds to a diagram when the cross sectional view shown in FIG. 4 is rotated by about 90° in a leftward direction. FIGS. 10 to 13 are diagrams showing integral values of relative energy in respective directions of a dielectric plate, based on simulation results. To elaborate, in FIGS. 10 to 13, the dielectric plate is divided into six sections in a circumferential direction thereof, and integral values of electric field intensity energy in the six sections are calculated. Then, the calculated integral values of the electric field intensity energy in the six sections are respectively divided by an average value thereof, and the integral values divided by the average value thereof are depicted in a radial direction of FIGS. 10 to 13. Here, although the dielectric plate is provided with slot holes having rotational symmetry even when the dielectric plate is rotated by about 60°, the rotational symmetry of the slot holes and the rotational symmetry of the stub member need not be same.

Figure 10:
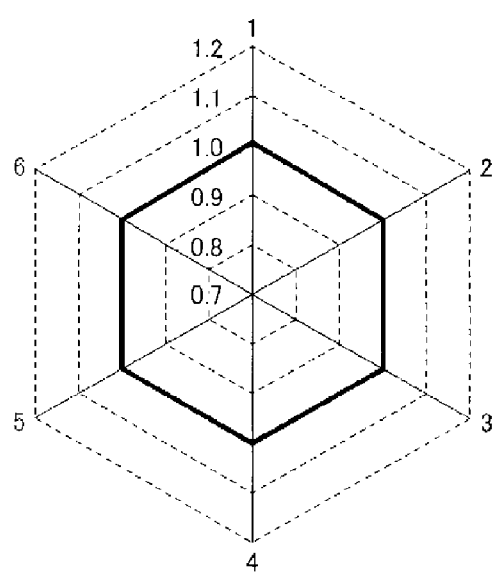
FIG. 10 is a diagram showing integral values of relative energy in respective directions of a dielectric plate when a distance between a leading end of a part of stub members and an outer surface of an inner conductor is a reference value.
Figure 11:
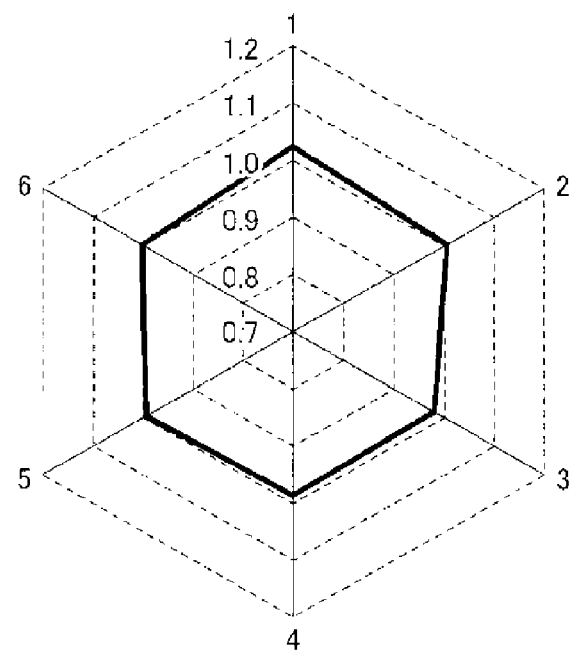
FIG. 11 is a diagram showing integral values of relative energy in respective directions of a dielectric plate when a distance between a leading end of a part of stub members and an outer surface of an inner conductor is about 6 mm.
Figure 12:
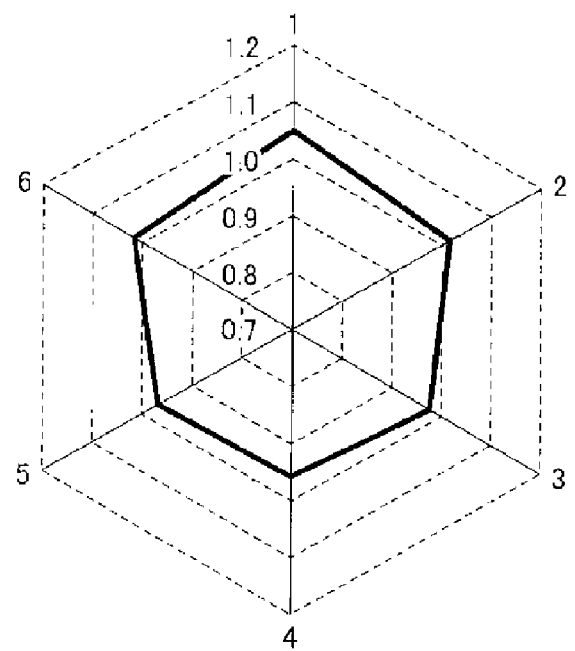
FIG. 12 is a diagram showing integral values of relative energy in respective positions of a dielectric plate when a distance between a leading end of a part of stub members and an outer surface of an inner conductor is about 4 mm.
Figure 13:
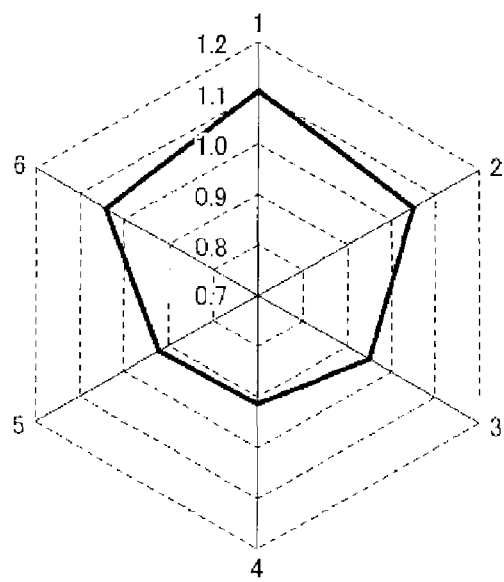
FIG. 13 is a diagram showing integral values of relative energy in respective directions of a dielectric plate when a distance between a leading end of a part of stub members and an outer surface of an inner conductor is about 2 mm.

Further, numbers assigned to the stub members in FIG. 9 and numbers assigned to the respective axes of the energy integral values of the dielectric plate in the radial direction in FIGS. 10 to 13 denote same circumferential positions. That is, the position of the stub member denoted by number 1 in FIG. 9 shows a section of the dielectric plate at a same position in the circumferential direction. FIG. 10 shows a case where the positions of the stub members are all the same and serve as a reference state. FIG. 11 illustrates a case where a distance between a leading end of each of the stub members denoted by numbers 1, 2 and 3 and an outer surface of an inner conductor is about 6 mm. FIG. 12 shows a case where a distance between a leading end of each of the stub members denoted by numbers 1, 2 and 3 and an outer surface of an inner conductor is about 4 mm. FIG. 13 illustrates a distance between a leading end of each of the stub members denoted by numbers 1, 2 and 3 and an outer surface of an inner conductor is about 2 mm. Further, as for uniformity in the circumferential direction, 1σ in FIG. 10 has a value of about 0.8%; 1σ in FIG. 11, a value of about 1.9%; 1σ in FIG. 12, a value of about 3.8%; and 1σ in FIG. 13, a value of about 7.6%. Here, σ denotes a standard deviation.

Referring to FIGS. 9 to 13, if the position of the stub member is changed, specifically, if the distance between the leading end of the rod-shaped member and the outer surface of the inner conductor is changed, the integral value of relative energy in the dielectric plate is greatly changed. Here, when manufacturing the plasma processing apparatus, although the centers of the inner conductor and the outer conductor in the radial direction are greatly deviated, and the integral values of relative energy becomes greatly different from the reference state shown in FIG. 10, the integral values of relative energy in respective sections can be adjusted by moving the stub members in the radial direction. Accordingly, a state similar to the reference state shown in FIG. 10 can be obtained without reassembling the inner conductor and the outer conductor. As a result, the plasma can be uniformly generated under the lower surface of the dielectric plate.

As a material of the stub member, it may be desirable that at least a part of the stub member to be positioned in the gap between the inner conductor and the outer conductor is made of a dielectric material. In this way, it is possible to lengthen the expected life span of the stub member. Further, the dielectric material may be, but not limited to, quartz or alumina. Alternatively, it may be possible that the entire stub member is made of a metal.

Desirably, a distance between the stub member and an upper end of the wavelength shortening plate in an axial direction of the coaxial waveguide may be within about 10 mm. To elaborate, referring back to FIG. 2, in the cross sectional view shown in FIG. 2, a distance $L_1$ in the axial direction between a center line 56 of the rod-shaped member 52 of the stub member 51 in an axial direction and an upper end 57 of the wavelength shorting plate protrusion 27 is set to be within about 10 mm. In the plasma processing apparatus 11 having the above-described configuration, the intensity distribution of the electromagnetic field in a region under the coaxial waveguide 31 greatly depends on the distance. Here, if the distance $L_1$ becomes longer than about 10 mm, the intensity of the microwave asymmetrically distributed in the circumferential direction may become symmetrical, i.e., returned to the reference state. Accordingly, by adopting the above-described configuration, the electromagnetic field distribution can be uniformized in the circumferential direction more efficiently.

Figure 14:
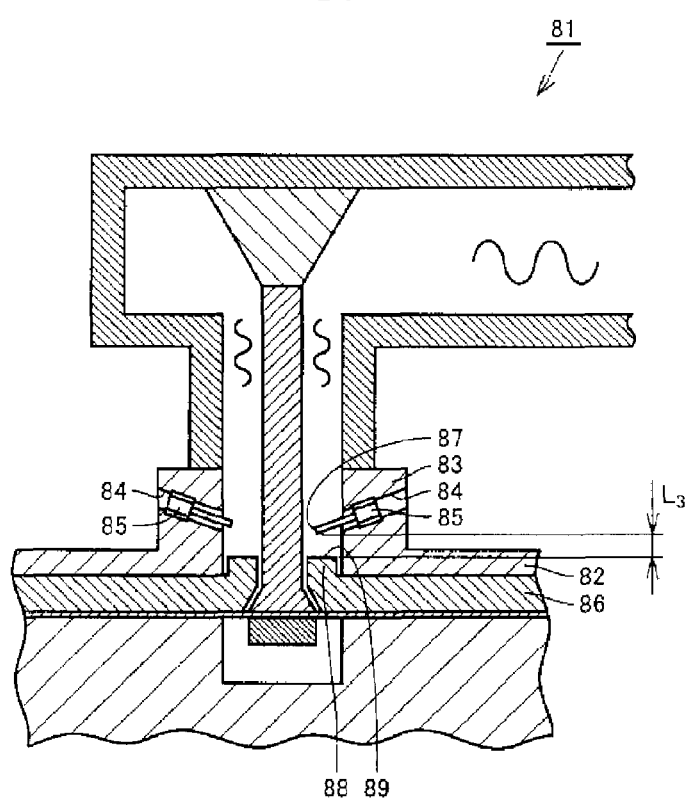
FIG. 14 is an enlarged schematic cross sectional view illustrating a coaxial waveguide and the vicinity thereof included in a plasma processing apparatus in accordance with another illustrative embodiment.

In the illustrative embodiment, the stub member is illustrated to be extended in a horizontal direction, i.e., extend straightly in the radial direction. However, as illustrated in FIG. 14, the stub member may be extended obliquely downward. FIG. 14 is a schematic cross sectional view showing an enlarged view of a coaxial waveguide of a plasma processing apparatus having such an obliquely extended stub member and its vicinity. FIG. 14 corresponds to FIG. 2. Referring to FIG. 14, a plasma processing apparatus 81 in accordance with another illustrative embodiment includes a cooling plate protrusion 83 of a cooling plate 82, and a multiple number of screw holes 84 are formed through a part of the cooling plate protrusion 83 so as to be extended obliquely downward toward an inner periphery. Stub members 85 are inserted in the respective screw holes 84 so as to be extended obliquely downward. With this configuration, operating parts of the stub members 85, specifically, leading ends of the stub members 85 can be positioned close to a wavelength shortening plate 86. In order to uniformly distribute the electromagnetic field in the circumferential direction, it may be desirable to adjust the stub members at positions as close to the wavelength shortening plate 86 as possible. Accordingly, by providing the stub members 85 to be extended obliquely downward, it may be possible to adjust the distribution of the electromagnetic field in the circumferential direction more effectively.

In such a case, when the stub member 85 is extended, a distance $L_3$ between a leading end 87 of the stub member 85 and an upper end 89 of a wavelength shortening plate protrusion 88 needs to be set to be equal to or smaller than about 10 mm. Further, in the plasma processing apparatus having the aforementioned configuration, it may be desirable that the distance varying device is configured to control the distance in the radial direction between the part of the outer surface of the inner conductor and the facing member facing the part of the outer surface of the inner conductor to be equal to or smaller than about 4 mm or less. To elaborate, referring to FIG. 2, the distance varying device is configured to control a distance $L_2$ in the radial direction between the outer surface 36 of the inner conductor 32 and the leading end 55 of the rod-shaped member 52 of the stub member 51 to have a range equal to or smaller than about 4 mm. With this configuration, it may be possible to improve the plasma distribution uniformity in the circumferential direction in wider range.

Although the stub member is described to be supported at the cooling plate protrusion in the above-described illustrative embodiments, the illustrative embodiments may not be limited thereto. By way of example, the stub member may be supported at the outer conductor. To be specific, a screw hole may be formed through the outer conductor in a radial direction, and by screwing a screw into the screw hole, the stub member may be fastened to the outer conductor. In such a case, a part of an inner surface of the outer conductor serves as a facing member facing the part of the outer surface of the inner conductor.

Moreover, in accordance with the above-described illustrative embodiments, the stub members are arranged at a regular interval so as to have rotational symmetry. However, the stub members may not be arranged at the regular interval as long as they have rotational symmetry.

In addition, in accordance with the above-described illustrative embodiments, the six stub members are arranged in the circumferential direction. However, the total number of the stub members may not be limited to six, but can be four, eight, or any number as necessary.

Further, in accordance with the above-described illustrative embodiments, although the six stub members are arranged at a same position in a direction where the coaxial waveguide is elongated, i.e., at a same vertical position, the illustrative embodiments may not be limited thereto. By way of example, a multiple number of stub members may be arranged at a regular interval in the direction where the coaxial waveguide is elongated. If the stub members serving as an electromagnetic field adjusting device are provided, a part of the microwave may be reflected upward by the rod-shaped members. Here, reflectivity is calculated by dividing an electric field intensity of the reflection wave by an electric field intensity of an incident wave, and a power loss as great as the reflectivity may be generated. Further, the adjustment of the electromagnetic field may become complicated by being affected by the reflection wave, and, thus, it may be difficult to uniformize the electromagnetic distribution. Accordingly, by providing the multiple number of stub members at the regular interval in the elongated direction of the coaxial waveguide, it is possible to reduce influence of the reflection wave from the stub members. Accordingly, the electromagnetic field can be easily adjusted, and the uniformity of the electromagnetic field distribution can be improved in the circumferential direction.

Figure 17:
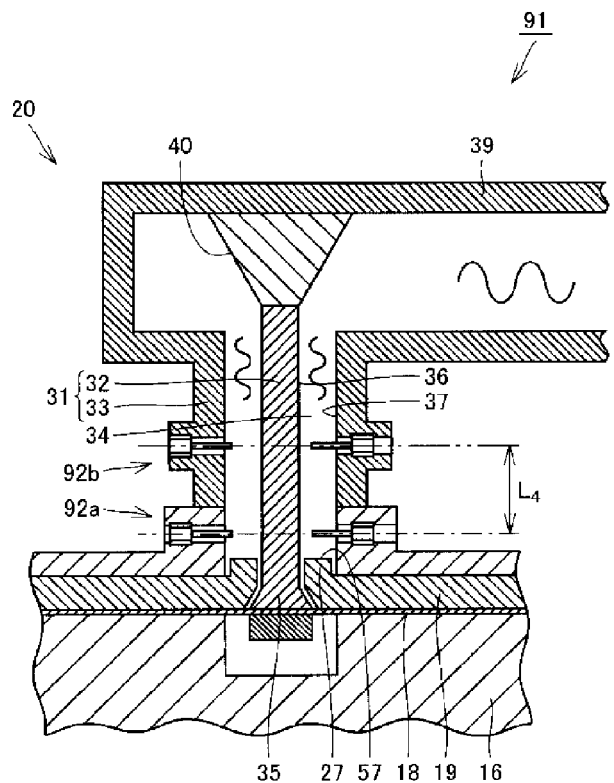
FIG. 17 is a schematic cross sectional view illustrating major parts of a plasma processing apparatus in accordance with still another illustrative embodiment.

Such configuration and effect will be described in detail. FIG. 17 is a cross sectional view illustrating a part of a plasma processing apparatus having the mentioned configuration, and FIG. 17 corresponds to FIG. 2. Referring to FIG. 17, a plasma processing apparatus 91 in accordance with still another illustrative embodiment includes two stub member groups 92a and 92b that are arranged in a vertical direction of FIG. 17. The first stub member group 92a located at a lower side serves as an electromagnetic field adjusting device and is provided at the cooling plate protrusion 47 of the cooling plate 43, as in the configuration of the plasma processing apparatus 11 of FIG. 1. Each stub member of the first stub member group 92a has the same configuration as the stub member provided in the plasma processing apparatus of FIG. 1. That is, each stub member of the first stub member group 92a is extensible straightly in a radial direction, and includes a rod-shaped member and a screw to be screwed into a screw hole formed in the cooling plate protrusion 47. Meanwhile, the second stub member group 92b at an upper side serves as a reflection wave compensation device and is provided at the outer conductor 33 of the coaxial waveguide 31. Like the stub members of the first stub member group 92a, each stub member of the second stub member group 92b is also extensible straightly in the radial direction. Further, the stub member includes a rod-shaped member and a screw to be screwed into a screw hole formed in the outer conductor 33.

Among the two stub member groups, the first stub member group 92a includes, as in the case shown in FIG. 1, six stub members arranged at a substantially regular interval in a circumferential direction. Likewise, the second stub member group 92b also includes six stub members arranged at a substantially regular interval in the circumferential direction. That is, the two stub member groups each having the six stub members arranged at the regular interval in the circumferential direction are vertically arranged with a gap therebetween.

As for positions of the stub members of the first and second stub member groups 92a and 92b in the circumferential direction, a position of each stub member of the first stub member group 92a is the same as a position of each corresponding stub member of the second stub member group 92b. That is, when viewed from the top of FIG. 17, the cross sectional view of FIG. 4 is shown, and the stub members of the first stub member group 92a and the stub members of the second stub member group 92b are shown to be overlapped. Further, a distance between the first stub member group 92a and the second stub member group 92b in the vertical direction, i.e., a distance $L_4$ between the first stub member group 92a and the second stub member group 92b is set to be equivalent to about ¼ of a wavelength of the microwave propagating in the coaxial waveguide 31. The distance $L_4$ between the first stub member group 92a and the second stub member group 92b is a distance between a center position of the first stub member group 92a and a center position of the second stub member group 92b in a axial direction, i.e., in the vertical direction. The center position of the first stub member group 92a is indicated by a dashed dotted line of FIG. 17, and the center position of the second stub member group 92b is indicated by a dashed double-dotted line of FIG. 17. Further, reflectivity of the microwave at each stub member of the first stub member group 92a and reflectivity of the microwave at each stub member of the second stub member group 92b are set to be same. Each stub member of the first and second stub member groups 92a and 92b may be made of, but not limited to, alumina or metal.

Figure 18:
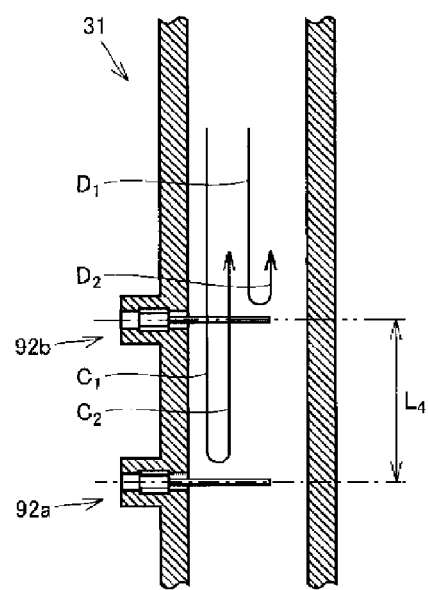
FIG. 18 is an enlarged schematic cross sectional view illustrating a coaxial waveguide and the vicinity thereof included in the plasma processing apparatus of FIG. 17.

With the above-described configuration, the electromagnetic field distribution can be uniformized more efficiently by using the first stub member group 92a as the electromagnetic field adjusting device and the second stub member group 92b as the reflection wave compensation device. In FIGS. 17 and 18, the same parts as those illustrated in FIGS. 1 and 2 will be assigned same reference numerals, and redundant description thereof will be omitted.

Here, the plasma processing apparatus 91 illustrated in FIG. 17 will be explained. FIG. 18 is an enlarged schematic cross sectional view illustrating the coaxial waveguide 31 and the vicinity thereof included in the plasma processing apparatus 91 of FIG. 17. For the convenience of understanding, configurations of the first and second stub member groups 92a and 92b are schematically shown in FIG. 18.

Referring to FIGS. 17 and 18, after an incident wave $C_1$ travelling in a downward direction from the top arrives at the stub members of the first stub member group 92a serving as the electromagnetic field adjusting device, a part of the incident wave $C_1$ is reflected upward as a reflection wave $C_2$. Further, after an incident wave $D_1$ arrives at the stub members of the second stub member group 92b serving as the reflection wave compensation device, a part of the incident wave $D_1$ is reflected upward as a reflection wave $D_2$. Here, since the reflection wave $C_2$ travels twice the distance $L_4$ between the first stub member group 92a and the second stub member group 92b, the reflection wave $C_2$ is lagged by the traveling time, so that the lagged reflection wave $C_2$ interferes with the reflection wave $D_2$. In the illustrative embodiment, since the distance $L_4$ between the first stub member group 92a and the second stub member group 92b is equivalent to about ¼ of the wavelength of the microwave propagating in the coaxial waveguide 31, the traveling distance between the first stub member group 92a and the second stub member group 92b becomes equivalent to about ½ of the wavelength of the microwave propagating in the coaxial waveguide 31. As a result, the phase of the reflection wave $C_2$ is different from the phase of the reflection wave $D_2$ by 180 degrees. Here, since the reflectivity at the stub members of the first stub member group 92a and the reflectivity at the stub members of the second stub member groups 92b are substantially same, the reflection waves $C_2$ and $D_2$ are offset against each other. Accordingly, the electromagnetic field can be adjusted while greatly reducing influence of the reflection wave. As a result, a uniform electromagnetic field can be formed more efficiently. Moreover, the 4E tuner 29c included in the microwave generator 15 has the movable short-circuit plates 30e to 30h. Further, the 4E tuner 29c is provided at the waveguide 39 and simply serves to adjust phase of microwave generated by the magnetron 29a. Meanwhile, the second stub member group 92b is provided at the coaxial waveguide 31 and has the stub members, and serves as the reflection wave compensation device for removing the reflection wave reflected from the first stub member group 92a. That is, the configuration of the 4E tuner 29c is greatly different from the configuration of the second stub member group 92b.

Here, although the reflectivity of the stub members of the first stub member group 92a and the reflectivity of the stub members of the second stub member group 92b are set to be same, each reflectivity may be set to have a range from about 0.1 to about 0.2, and the total reflectivity may be set to be equal to or smaller than about 0.03. To be more precise, the incident wave $C_1$ may be reduced because a part thereof is reflected by the stub members of the second stub member group 92b. Thus, in consideration of this influence, it may be possible to control the reflectivity of the stub members of the first stub member group 92a and the reflectivity of the stub members of the second stub member group 92b to be different from each other.

Moreover, in the illustrative embodiment depicted in FIG. 17, the vertical gap between the first stub member group and the second stub member group is set to be about ¼ of the wavelength of the microwave propagating in the coaxial waveguide. However, the vertical gap may not be limited thereto, but may be set to be about an odd number multiple of ¼ of the wavelength of the microwave propagating in the coaxial waveguide. By setting the vertical gap in this way, the phases of the respective reflection waves can be inverted 180 degrees, and the aforementioned effect can be obtained. Further, even if the vertical gap is slightly deviated from about the odd number multiple of ¼ of the wavelength of the microwave propagating in the coaxial waveguide, the influence of the reflection waves can be reduced.

Moreover, in the illustrative embodiment shown in FIG. 17, although the positions of the stub members of the first stub member group in the circumferential direction and the positions of the stub members of the second stub member group in the circumferential direction are set to be same, they may be deviated in the circumferential direction. Furthermore, the number of the stub members belonging to the first stub member group and the number of the stub members belonging to the second stub member group may be set to be different.

In addition, in the illustrative embodiment illustrated in FIG. 17, although the stub members of the first and second stub member groups are provided so as to be extensible straightly in the radial direction, the illustrative embodiment may not be limited thereto. By way of example, each stub member may be extended in an obliquely downward direction. In such a case, the stub member belonging to one of the first and second stub member groups may be configured to be extensible in the obliquely downward direction, or the stub members of both of the first and the second stub member groups may be configured to be extensible in the obliquely downward direction.

Moreover, in the above-described embodiments, although the stub member is used as the distance varying device, the distance varying device may not be limited thereto. By way of example, as the distance varying device, there may be provided a protrusion to be extended from the inner surface of the outer conductor in the radial direction, and the protrusion may serve to adjust an extension distance thereof. Furthermore, the outer surface of the outer conductor may have a concave shape, and by the concave surface of the outer conductor, a distance between an inner surface of the outer conductor and an outer surface of the inner conductor may be varied.

In the above-described illustrative embodiments, although the distance varying device is provided at the outer conductor, the location of the distance varying device may not be limited thereto. By way of example, the distance varying device may be provided at the inner conductor. To elaborate, the distance varying device may be configured to be extensible outward from an outer surface of the inner conductor, i.e., toward a gap between the inner conductor and the outer conductor, and an extension distance may be controlled.

Further, in the above-described illustrative embodiments, although the lower surface of the dielectric plate is described to be flat, the illustrative embodiments may not be limited thereto. By way of example, a recess toward an inner side of the dielectric pate, i.e., depressed upward may be formed in the lower surface of the dielectric plate.

While various aspects and embodiments have been described herein, other aspects and embodiments will be apparent to those skilled in the art. The various aspects and embodiments disclosed herein are for the purposes of illustration and are not intended to be limiting. Therefore, the true scope and spirit of the invention is indicated by the appended claims rather than by the foregoing description, and it shall be understood that all modifications and embodiments conceived from the meaning and scope of the claims and their equivalents are included in the scope of the invention.

[Industrial Applicability]

A plasma processing apparatus in accordance with the illustrative embodiments may be effectively used to perform a plasma process uniformly within a surface of a processing target substrate.

[Explanation of Codes]

11, 81, 91: Plasma processing apparatus
12: Processing chamber
13: Gas supply unit
14: Holding table
15: Microwave generator
16: Dielectric plate
17: Slot hole
18: Slot plate
19, 86: Wavelength shortening plate
20: Microwave supply unit
21: Bottom
22: Sidewall
23: Gas exhaust hole
24: O-ring
25: Surface
26a: Inner slot hole group
26b: Outer slot hole group
27, 88: Wavelength shortening plate protrusion
28: Center
29a: Magnetron
29b: Isolator
29c: 4E tuner 30a, 30b, 30c, 30d: Recess
30e, 30f, 30g, 30h: Movable short-circuit plate
31, 61, 71: Coaxial waveguide
32, 62, 72: Inner conductor
33, 63, 73: Outer conductor
34: Gap
30i, 35, 38, 57, 89: End
36: Outer surface
37, 50: Inner surface
39: Waveguide
40: Mode converter
41: Dielectric plate pressing ring
42: Antenna pressing member
43, 82: Cooling plate
44: Electromagnetic field shielding elastic body
45: Periphery fixing ring
46: Center fixing plate
47, 83: Cooling plate protrusion
48: Wavelength shortening plate positioning member
49: Receiving recess
51, 74, 85: Stub member
52: Rod-shaped member
53: Screw
55, 84: Screw hole
55, 87: Leading end
56: Center line
64, 75: Electric force line
65, 76: One-dimensional equivalent circuit
66, 67, 77, 78: Capacitor
79: Hatch
92a, 92b: Stub member

What is claimed is:

1. A plasma processing apparatus comprising:
a processing chamber, having a top opening, configured to perform therein a plasma process on a processing target substrate;
a gas supply unit configured to supply a plasma processing gas into the processing chamber;
a mounting table that is provided within the processing chamber and is configured to mount the processing target substrate;
a microwave generator configured to generate a microwave for plasma excitation;
a dielectric plate placed for sealing the processing chamber hermetically by covering the top opening of the processing chamber and configured to transmit the microwave into the processing chamber;
a slot antenna plate, having a plurality of slot holes, provided on the dielectric plate and configured to radiate the microwave into the dielectric plate;
a wavelength shortening plate provided on the slot antenna plate and configured to propagate the microwave in a radial direction; and
a microwave supply unit configured to supply the microwave generated by the microwave generator to the slot antenna plate,
wherein the microwave supply unit comprises:
a coaxial waveguide including a substantially circular rod-shaped inner conductor whose one end is connected to a center of the slot antenna plate and a substantially cylindrical outer conductor provided outside the inner conductor with a gap therebetween in a radial direction; and
a distance varying device disposed proximate an upper surface of the wavelength shortening plate and configured to vary a distance between a part of an outer surface of the inner conductor and a facing member facing the part of the outer surface of the inner conductor in a radial direction,
wherein the distance varying device includes at least one stub member extensible from the outer conductor toward the inner conductor in an obliquely downward direction so that a leading end of the stub member is extended to be closer than a trailing end of the stub member, to the wavelength shortening plate.

2. The plasma processing apparatus of claim 1, wherein the stub member includes a rod-shaped member supported at the outer conductor and extensible in the radial direction; and a moving distance adjusting member for adjusting a moving distance of the rod-shaped member in the radial direction.

3. The plasma processing apparatus of claim 1, wherein the at least one stub member is plural in number, and the stub members are arranged at an interval in a circumferential direction.

4. The plasma processing apparatus of claim 3, wherein the stub members are arranged at a regular interval in the circumferential direction.

5. The plasma processing apparatus of claim 1, wherein at least a part of the stub member to be located in the gap is made of a dielectric material.

6. The plasma processing apparatus of claim 1, wherein the distance varying device is configured to control a distance between the part of the outer surface of the inner conductor and the facing member thereto in the radial direction to be equal to or smaller than about 4 mm.

7. The plasma processing apparatus of claim 1, wherein the microwave generator includes a magnetron, an isolator and a tuner.

8. The plasma processing apparatus of claim 1,
wherein a distance between an uppermost surface of the wavelength shortening plate and the leading end of the stub member in an axial direction of the coaxial waveguide is set to be equal to or smaller than about 10 mm.

* * * * *

UNITED STATES PATENT AND TRADEMARK OFFICE
CERTIFICATE OF CORRECTION

PATENT NO. : 9,237,638 B2  
APPLICATION NO. : 13/391310  
DATED : January 12, 2016  
INVENTOR(S) : Kiyotaka Ishibashi et al.

Page 1 of 1

It is certified that error appears in the above-identified patent and that said Letters Patent is hereby corrected as shown below:

In the specification

Column 7, line 27, please add - 21 - between "bottom" and "of".

Column 7, line 63, please add - 19 - between "plate" and "is".

Column 8, line 39, please add - 32 - between "conductor" and "in".

Column 10, line 8, please add - 47 - between "protrusion" and "in".

Column 10, line 27, please add - 51 - between "member" and "serves".

Column 10, line 31, please add - 32 - between "conductor" and "in".

Column 10, line 37, please add - 53 - after "screw".

Signed and Sealed this  
Nineteenth Day of April, 2016

Michelle K. Lee  
*Director of the United States Patent and Trademark Office*